United States Patent
Amann et al.

(10) Patent No.: US 8,971,375 B2
(45) Date of Patent: Mar. 3, 2015

(54) POLARIZATION-STABLE SURFACE-EMITTING LASER DIODE

(75) Inventors: Markus-Christian Amann, München (DE); Markus Ortsiefer, München (DE); Jürgen Rosskopf, Wolfratshausen (DE)

(73) Assignee: Vertilas, GmbH, Garching (DE)

( * ) Notice: Subject to any disclaimer, the term of this patent is extended or adjusted under 35 U.S.C. 154(b) by 0 days.

(21) Appl. No.: 13/988,323

(22) PCT Filed: Oct. 28, 2011

(86) PCT No.: PCT/EP2011/069062
§ 371 (c)(1),
(2), (4) Date: Aug. 30, 2013

(87) PCT Pub. No.: WO2012/065834
PCT Pub. Date: May 24, 2012

(65) Prior Publication Data
US 2013/0336351 A1    Dec. 19, 2013

(30) Foreign Application Priority Data

Nov. 17, 2010 (DE) .................. 10 2010 044 082
Oct. 5, 2011 (DE) .................. 10 2011 084 047

(51) Int. Cl.
*H01S 3/08* (2006.01)
*H01S 5/183* (2006.01)
*H01S 5/028* (2006.01)

(52) U.S. Cl.
CPC ......... *H01S 5/18355* (2013.01); *H01S 5/18361* (2013.01); *H01S 5/0282* (2013.01); *H01S 5/18377* (2013.01)
USPC ........................................... 372/99; 382/106

(58) Field of Classification Search
CPC ............ H01S 3/10061; H01S 3/08036; H01S 5/06236; H01S 5/18355; H01S 5/3404
USPC ............................................... 372/99, 98, 106
See application file for complete search history.

(56) References Cited

U.S. PATENT DOCUMENTS 3,469,206 A * 9/1969 Harris et al. .................... 372/24
4,875,220 A * 10/1989 Krueger et al. ............... 372/107
(Continued)

FOREIGN PATENT DOCUMENTS

DE    10 2011 084 047    5/2012
EP    0 820 131 A1    1/1998
(Continued)

OTHER PUBLICATIONS

Tadanaga, O., et al. "AN 850-nm InAlGaAs Strained Quantum-Well Vertical-Cavity Surface-Emitting Laser Grown on GaAs (311)B Substrate with High-Polarization Stability" IEEE Photonics Technology Letters, vol. 12, No. 8, Aug. 2000, pp. 942-944.
(Continued)

*Primary Examiner* — Xinning Niu
*Assistant Examiner* — Vu A Vu
(74) *Attorney, Agent, or Firm* — Lathrop & Gage LLP

(57) ABSTRACT

The present invention relates to a surface-emitting laser diode with an active amplifying region (2) which is bounded by two laser mirrors (1, 3), while one or more polarization-selective layers (4) are provided for stabilizing the polarization in a region that is located on that side of at least one of the laser mirrors (1, 3) that is opposite the active amplifying region (2), these layers (4) extending parallel to the respective mirror (1; 3) and having a polarization-dependent refractive index and/or absorption.

9 Claims, 7 Drawing Sheets

(56) References Cited

U.S. PATENT DOCUMENTS

2007/0242715 A1* 10/2007 Gustavsson et al. ....... 372/45.01
2008/0112443 A1   5/2008 Lee et al.

FOREIGN PATENT DOCUMENTS

| JP | 10-075014 | 3/1998 |
| JP | 2001060337 A | 3/2001 |
| JP | 2002509283 A | 3/2002 |
| JP | 2005 093 588 | 4/2005 |
| JP | 2008 205 240 | 9/2008 |
| WO | WO 2006/136346 | 12/2006 |
| WO | WO 2007/057807 | 5/2007 |

OTHER PUBLICATIONS

Hodgkinson, I. et al., "Biaxial Thin-Film Coated-Plate Polarizing Beam Splitters", Applied Optics, Mar. 1, 2006, vol. 45, No. 7, pp. 1563-1568.

Beydaghyan, G. et al. "Enhanced Birefringence in Vacuum Evaporated Silicon Thin Films" Applied Optics, Oct. 1, 2004 vol. 43, No. 28, pp. 5343-5349.

Ortsiefer, M. et al. "Polarization Control in Buried Tunnel Junction VSCELs Using a Birefringent Semiconductor/Dielectric Subwavelength Grating" IEEE Photonics Technology Letters, vol. 22, No. 1, Jan. 1, 2010, pp. 15-17.

Ser, J-H, et al. "Polarization stabilization of vertical-cavity top-surface-emitting lasers by inscription of fine metal-interlaced gratings", Appl. Phys. Lett. 66 (21), May 22, 1995.

Debernardi, P., et al., "Reliable Polarization Control of VCSELs Through Monolithically Integrated Surface Grartings: A Comparative Theoretical and Experimental Study" IEEE Journal of Selected Topics in Quantum Electronics, vol. 11, No. 1, Jan./Feb. 2005, pp. 107-116.

Hodgkinson, I., et al. "Serial Bideposition of Anisotropic Thin Films With Enhanced Linear Birefringence", Applied Optics, Jun. 1, 1999, vol. 38, No. 16, pp. 3621-3625.

Motohiro, T. & Taga, Y. "Thin Film Retardation Plate by Oblique Deposition" Appl Opt. Jul. 1, 1989;28(13):2466-82.

Hodgkinson, I., et al. "Measurement of the Principal Refractive Indices of Thin Films Deposited at Oblique Incidence", vol. 2, No. 10, Oct. 1985/J. Opt. Soc. Am. A, pp. 1693-1697.

Mukaihara, T. et al., "Polarization control of vertical-cavity surface emitting lasers using a birefringent metal/dielectric polarizer loaded on top distributed Bragg reflector" Selected Topics in Quantum Electronics, IEEE Journal of (vol. 1 , Issue: 2) Jun. 1995pp. 667-673.

PCT/EP2011/069062 English Translation of the International Preliminary Report on Patentability, Sep. 14, 2012, 7 pages.

PCT/EP2011/069062 English Translation of the International Search Report, Feb. 6, 2012 3 pages.

* cited by examiner

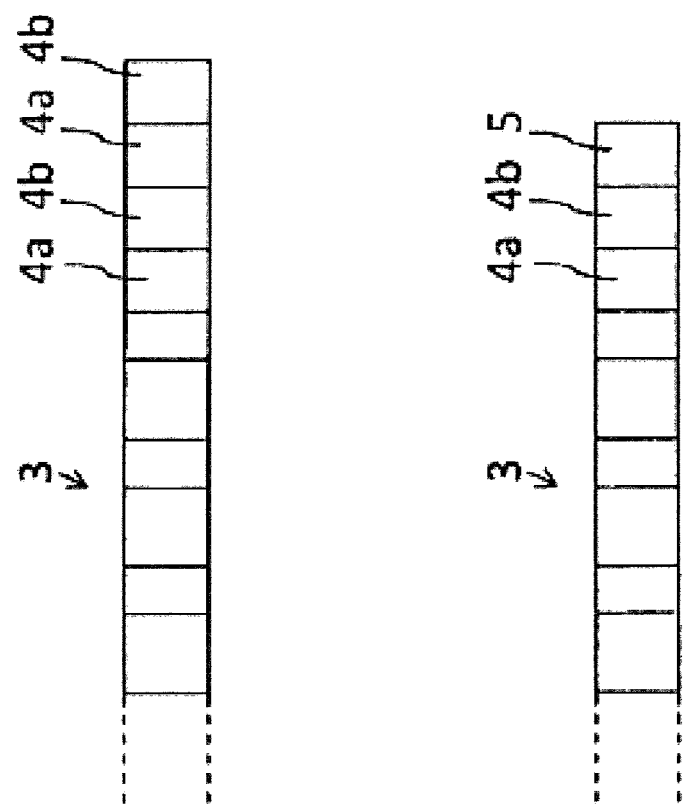

POLARIZATION-STABLE SURFACE-EMITTING LASER DIODE

RELATED APPLICATIONS

This application is a national stage entry of PCT Application No. PCT/EP2011/069062, filed Oct. 28, 2011, which claims priority to German Application No. 102011084047.8, filed Oct. 5, 2011, and to German Application No. 102010044082.5, filed Nov. 17, 2010. Each of the aforementioned applications are incorporated by reference herein.

BACKGROUND

Surface-emitting laser diodes (known as Vertical-Cavity Surface-Emitting Lasers: VCSEL) are increasingly used in modern optoelectronic systems, on account of their numerous advantages such as low threshold currents and symmetrical lobes and are gradually replacing the conventional edge-emitting semiconductor lasers. Because of their more or less distinct transverse symmetry (rotational symmetry) the VCSELs have no or only inadequate polarization selectivity. In use, this may lead to polarization instabilities and polarization switches, ruling out the use of such lasers for most applications.

Surface-emitting laser diodes generally have a cylindrically symmetrical structure and on the basis of their design and manufacturing method have no preferential direction for the direction of polarization of the radiated wave. There are therefore two orthogonal states relating to the direction of polarization of the radiated wave. In an ideal laser structure, these two states are energetically degenerate and are equally suitable for laser operation. However, because of the electro-optical effect and anisotropies in the component design as well as asymmetries and fluctuations in the manufacturing process, this degeneracy is eliminated and the VCSEL oscillates dominantly only in the preferred polarization mode. In most cases the mechanism that leads to a particular mode being preferred is difficult to control or not obvious and poorly distinguished, with the result that the polarization process as a whole is random and unstable in nature. The polarization switches generally limit use in polarization-dependent optical systems. For example, such switches in optical data transmission lead to increased noise. As numerous applications rely on polarization-stable lasers as light sources, this represents a significant reduction in the production yield. In many cases a preferential direction can indeed be defined but the elimination of the degeneracy is not powerful enough to guarantee polarization stability under varying environmental and operational conditions. In this case, even minor changes in these parameters may cause alternation between the two states ("pole flip").

In the past, numerous possible solutions for stabilizing polarization were studied. In order to achieve polarization stability for GaAs-based VCSEL, growth was successfully shown on higher-indexed [311] substrates in O. Tadanaga, K. Tateno, H. Uenohara, T. Kagawa, and C. Amano, "An 850-nm InAlGaAs Strained Quantum-Well Vertical-Cavity Surface-Emitting Laser Grown on GaAs (311)B Substrate with High-Polarization Stability", IEEE Photon. Technol. Lett., 12, 942 (2000). However, since the other laser properties generally deteriorate and there are difficult growth conditions particularly for InP-based semiconductor layers, this method does not appear to be suitable for long-wave VCSEL.

Another approach to the problem is the use of dielectric or metallic grating structures as in J.-H. Ser et al., "Polarization stabilization of vertical-cavity top-surface-emitting lasers by inscription of fine metal-interlaced gratings", Appl. Phys. Lett. 66, 2769 (1995); T. Mukaihara et al., "Polarization control of vertical-cavity surface-emitting lasers using a birefringent metal/dielectric polarizer loaded on top distributed Bragg Reflector", IEEE J. Sel. Top. Quantum. Electron. 1, 667 (1995); M. Ortsiefer et al., "Polarization Control in Buried Tunnel Junction VCSELs Using a Birefringent Semiconductor/Dielectric Subwavelength Grating", IEEE Photon. Technol. Lett., 22, 15 (2010) and P. Debernardi et al.: "Reliable Polarization Control of VCSELs Through Monolithically Integrated Surface Gratings: A Comparative Theoretical and Experimental Study", IEEE J. Sel. Top. Quantum Electron. 11, 107 (2005). Metallic-dielectric gratings with subwavelength dimensions are used to produce birefringence in the laser resonator. Thus the optical resonator length, or the resonating frequency of the laser resonator, can only correspond to the maximum of the Bragg reflector or reflectors during one polarization. The other polarization is thus suppressed. The dielectric gratings proposed, on the other hand, make use of interference effects in the grating, as a result of which the total reflection is amplified or attenuated by the grating, dependent on polarization. The periodicity of the corresponding grating structures should not therefore be below approximately half a vacuum wavelength. One approach for the BTJ (Buried Tunnel Junction)—VCSEL produced by the Applicant with integrated subwavelength gratings of short periodicity ($<\lambda/2$) was recently proposed by M. Ortsiefer et al., "Polarization Control in Buried Tunnel Junction VCSELs Using a Birefringent Semiconductor/Dielectric Subwavelength Grating", IEEE Photon. Technol. Lett., 22, 15 (2010). Generally, the technology of the subwavelength gratings is complicated and laborious (nanostructuring), particularly when they have to be filled with other dielectrics, even though the advantages are clear.

JP 2005-093858 A describes a VCSEL with a birefringent layer on the outside of a mirror of the resonator. This leads to a preferential direction of polarization, however, to a reduction in the total reflection.

In US 2008/112443 A1 is shown a VCSEL with an external resonator mirror. Inside the resonator is arranged a polarization-selective layer.

WO 2007/057807 A2 of Philips Forschungslaboratorien proposed, in 2005, inserting a layer with a polarization-dependent refractive index or polarization-dependent absorption within the VCSEL resonator in front of one of the two end mirrors, so that the effective mirror reflection becomes polarization-dependent and thus one polarization mode is preferred and is actuated. A serious disadvantage of this method, and of all processes that place polarization-selective elements inside the laser resonator, is the simultaneous effect on the (optical) resonator length and hence on the laser wavelength. There may also be losses in the anisotropic layers, particularly in layers applied by oblique angle vapor deposition, which could noticeably impair the laser properties (e.g. the threshold). Moreover, a more complicated manufacturing technology and a reduced yield are obtained when the laser wavelength has to be adhered to precisely.

SUMMARY OF THE EMBODIMENTS

The aim of the present invention is to overcome the abovementioned disadvantages in the prior art, and particularly to provide a polarization-stable surface-emitting laser diode which requires a less complicated manufacturing technology.

The present invention solves the problem of polarization selection and stabilization in VCSELs by producing optical birefringence in a dielectric laser mirror using a comparatively simple and effective technology and thereby obtaining a polarization-dependent reflectivity which gives preference to one of the two in-plane polarizations. For this purpose, in contrast to the known arrangement in the published specification WO 2007/057807 A2, one or more layers with a polarization-dependent refractive index is or are applied to the outside of one or both laser mirrors. The surface-emitting laser diode according to the invention comprises an active amplifying region which is bounded by two laser mirrors, while one or more polarization-selective layers are provided for stabilizing the polarization in a region which is located on that side of at least one of the laser mirrors that is opposite the active amplifying region, these layers extending parallel to the respective mirror and having a polarization-dependent refractive index and/or absorption. In this way it is possible to ensure that the laser wavelength can be adjusted independently of the polarization stabilization and losses in the layers have virtually no effect on the laser threshold. The production and application of the polarization-dependent layers onto the laser mirrors may be carried out relatively simply by oblique angle vapor deposition of dielectrics, e.g. silicon.

The present invention thus provides a proposed solution for polarization-stable surface-emitting laser diodes. The idea is based on the use of an optically anisotropic dielectric mirror which has a different reflectivity dependent on the direction of polarization because of the polarization-dependent refractive index of the layer(s). The anisotropy is produced for example by oblique angle vapor deposition of one or more dielectric layers of the mirror. The mirror structure according to the invention makes it possible to obtain deterministic and stable polarization characteristics with high polarization mode/side mode suppression and ensures that the polarization is not sensitive to feedback.

It is advantageous for the production process if a polarization-selective layer is applied directly to one of the laser mirrors.

In particular, a plurality of polarization-selective layers are provided on the outside of a laser mirror, which are each alternately rotated through 90° relative to their polarization alignment, and for one polarization their reflection phase is the same as that of the laser mirror on whose side they are located and for the other polarization it is opposite. It is particularly advantageous to select the layer thicknesses to correspond to one-quarter of the laser wavelength in the preferred polarization. More detailed explanations of such a construction and its advantages can be found hereinafter in the exemplifying embodiments.

It is also advantageous if the one or the plurality of the polarization-selective layers on the side remote from the respective laser mirrors is or are followed by an isotropic layer consisting in particular of aluminium oxide or silicon nitride, while additionally the thickness of this isotropic layer corresponds in particular to half a wavelength of the laser light in this layer. More detailed explanations of the configuration and advantages of this embodiment can also be found in the exemplifying embodiments.

BRIEF DESCRIPTION OF THE FIGURES

FIG. 7 shows further embodiments of a schematically shown structure of a surface-emitting laser diode according to the invention.

DETAILED DESCRIPTION OF THE DRAWINGS

The invention and its advantages will now be described in more detail by means of exemplifying embodiments. It should be pointed out that the features of the examples of surface-emitting laser diodes according to the invention described herein may be implemented not only in the combination given here but also in other combinations, without the need for all the possible combinations to be explicitly mentioned and described.

Figure 1:
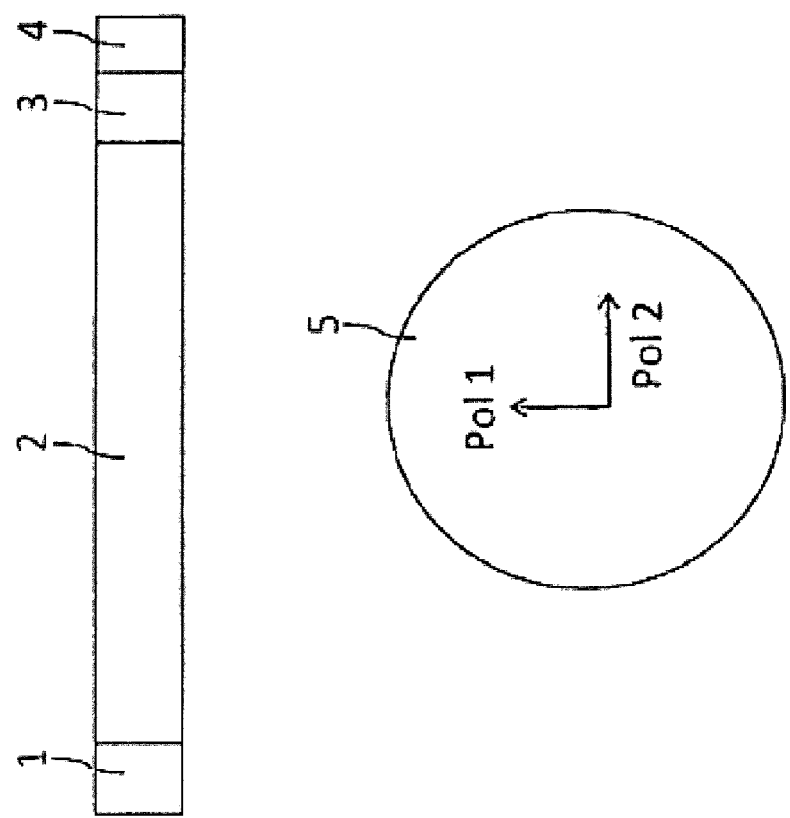
FIG. 1 shows a first embodiment of a structure of a surface-emitting laser diode according to the invention.

A possible embodiment of the invention is shown in FIG. 1. At the top is shown a diagrammatic longitudinal section through a laser according to the invention. This consists of the active amplifying region 2 which is bounded by two mirrors 1 and 3, and the resonator length and hence the laser wavelength of which is determined by said mirrors. The polarization stabilization according to the invention is achieved by the sequence of layers 4 additionally provided on the outside of one (or both) mirror(s) 3. This layer sequence may consist of one or more layers, of which at least one has a polarization-dependent refractive index or absorption. FIG. 1 schematically shows, at the bottom, the laser cross-section 5 which is rotationally symmetrical or elliptical. The directions of the two polarizations Pol 1 and Pol 2 which are perpendicular to one another are illustrated by two vectors. The mirrors 1 and 3 usually consist of numerous pairs of dielectric layers of different refractive indices. The laser light is reflected from each layer interface, yielding a correspondingly high total reflection of typically more than 99%.

Figure 2:
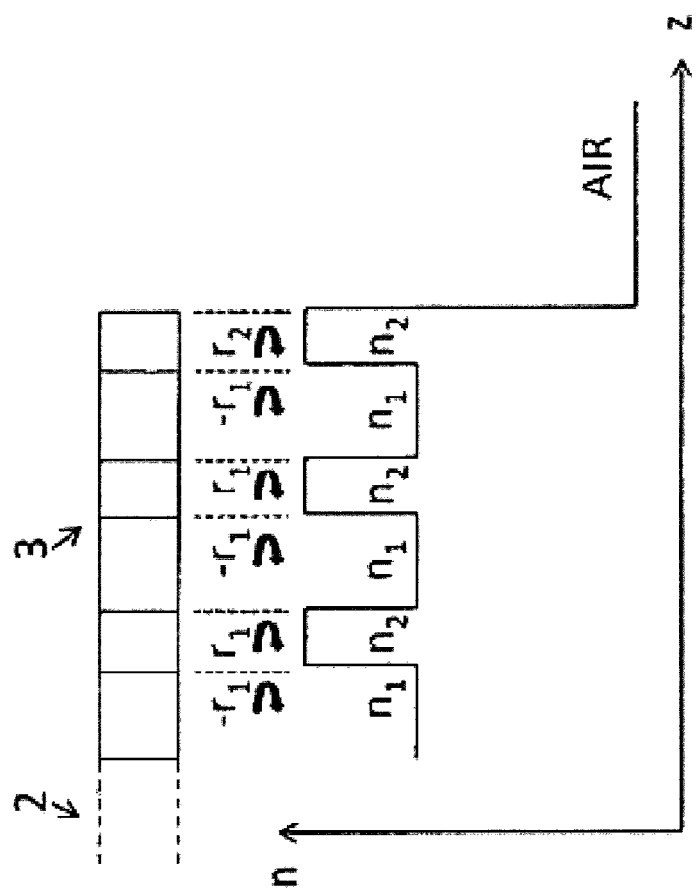
FIG. 2 shows a typical arrangement of a diagrammatic longitudinal section through a laser diode according to the prior art and the associated refractive index profile.

A typical arrangement according to the prior art without the layers 4 is shown in FIG. 2. The individual reflections r1 and −r1 are added together in the correct phase with the end reflection r2 against the outer region "AIR". As the refractive indices n1 and n2 of the pairs of mirrors are polarization-independent, i.e. they do not have any birefringence, the total reflectivity that the light beam from the laser resonator 2 undergoes is polarization-independent.

The laser structure according to the invention generates a polarization-dependent total reflection for the light coming out of the resonator 2, with a layer or sequence 4 of layers applied to the outside of the mirror 3, and stabilizes the laser polarization, as the laser then emits in the polarization which the higher total reflection comprises.

Figure 3:
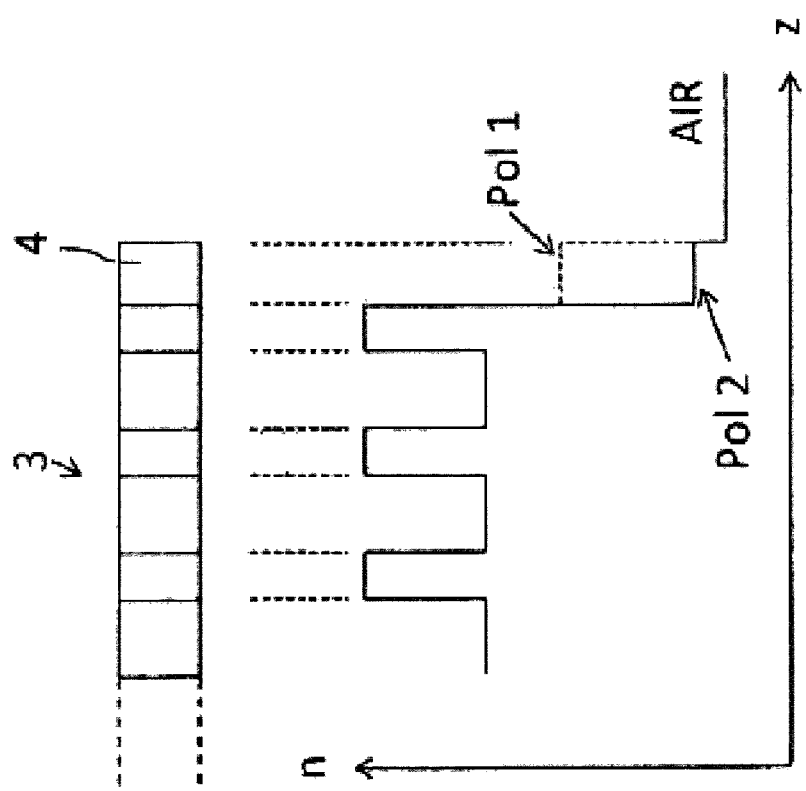
FIG. 3 shows part of the structure according to prior art of a longitudinal section in diagrammatic view together with the refractive indices assigned to the layers.

A first embodiment with only one layer 4 is shown in FIG. 3. The refractive indices n in the layer 4 for the two polarizations (Pol 1, Pol 2) are indicated by solid and dashed lines, respectively. Because of the different refractive indices, different or polarization-dependent reflection factors are produced at the interfaces of the layer 4. Together with the reflection of the mirror 3 this results in a polarization-dependent total reflectivity at the interface with the resonator 2. Calculations show that a difference in the total reflectivity of at least 0.01%, preferably at least 0.1%, is necessary in order to achieve stable laser emission in only one polarization.

Figure 4:
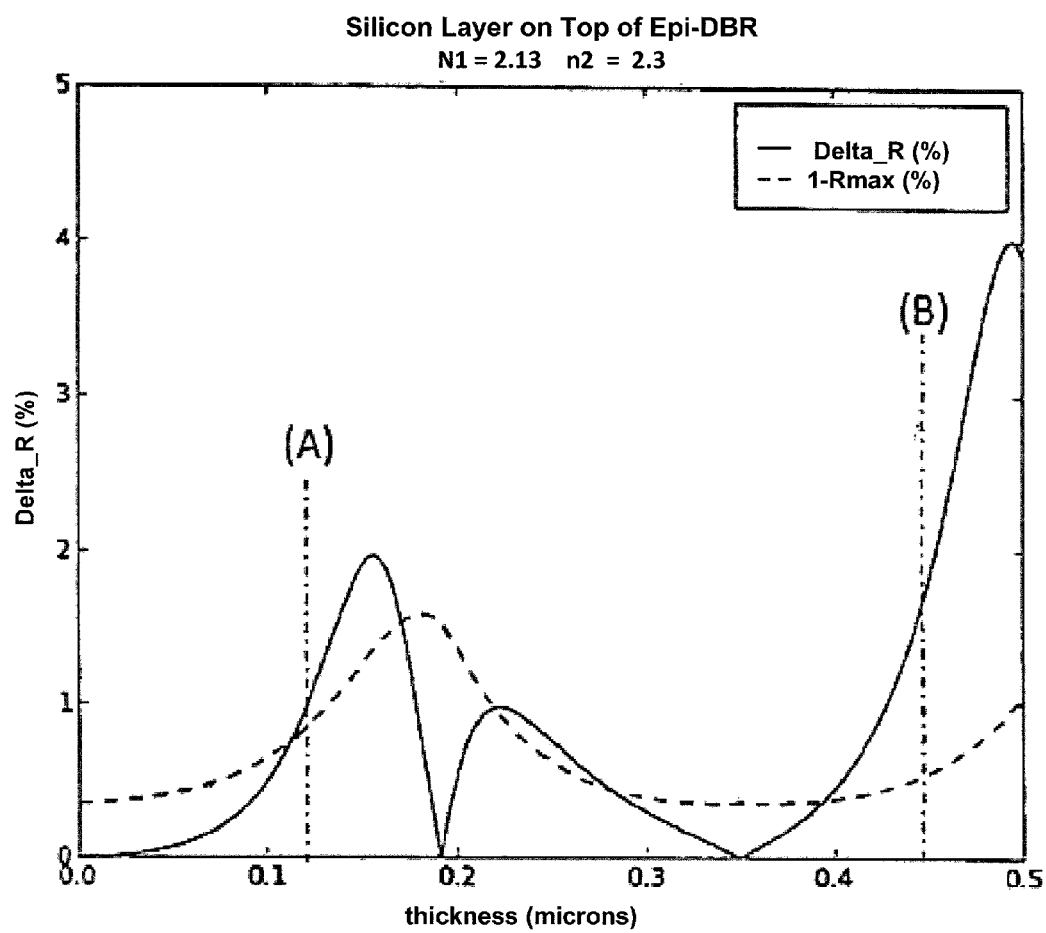
FIG. 4 shows the transmission ("1-Rmax(%)") as a dashed line as a function of the thickness of the layer in microns ("thickness (microns)") and the difference in the reflectivities ("Delta-R(%)*5") of the two polarizations as a solid line (multiplied by the factor 5), also dependent on the layer thickness of the silicon layer; both the transmission curve and the difference curve of the reflectivities are plotted in percent.

FIG. 4 shows a calculation of a laser structure for a wavelength of 1.55 μm coated with a silicon layer of variable thickness that has been applied by oblique angle vapor deposition at an angle of 60° ("Silicon Layer on Top of Epi-DBR" (=mirror)). The refractive indices of this silicon applied by oblique angle vapor deposition at the laser wavelength were experimentally determined for the two polarizations as about 2.13 (n1) and 2.3 (n2), respectively. The total reflectivity of the mirror 3 without the layer 4 is about 99.6%. The graph shows, by dashed lines, the transmission, i.e. the difference in total reflectivity at 100%, and by solid lines the difference in reflectivities of the two polarizations. To improve the illustration the differential reflectivity was multiplied by a factor of 5. As can be seen, a difference in reflectivities of 0.2% can easily be obtained with an Si layer 120 nm thick (A) or a difference of even 0.6% can be obtained with an Si layer 450 nm thick (B). In contrast to arrangements with the polarization-selective layer inside the resonator (WO 2007/057807 A2) the wavelength of the laser remains practically constant irrespective of the thickness of the layer 4. As may also be seen from FIG. 4, the polarization selectivity is accompanied by increased transmission, which denotes a reduced overall reflection and ultimately leads to a higher laser threshold. The arrangement in FIG. 3, particularly at points (A) and (B), also comprises a marked dependency of the total reflection on the Si layer thickness (cf. FIG. 4), as a result of which fluctuations in parameters during the manufacturing process could reduce the laser yield. Therefore an arrangement which brings about a polarization-dependent reflectivity without reducing the total reflection would be preferable.

Figure 5:
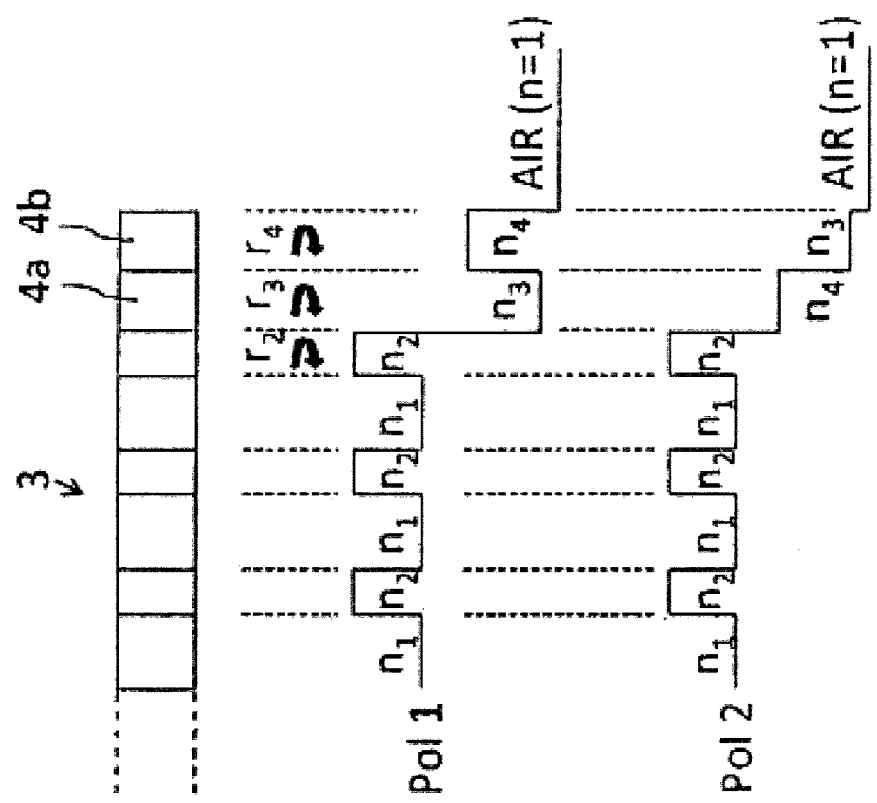
FIG. 5 shows another embodiment of a structure of a surface-emitting laser diode according to the invention, in schematic longitudinal section with two polarization-selective layers and the associated refractive index profile for the two polarizations.

Another embodiment of the invention which does not have this disadvantage, in that it allows polarization-selective total reflection without lowering the total reflection, can be obtained by applying a plurality of polarization-selective layers if they are each alternately rotated through 90° relative to their polarization alignment and for one polarization their reflection phase is the same as that of the laser mirror 3 on the side of which they are located and for the other polarization it is opposite. In practice this can be achieved very simply in vapor deposition if the direction from which the oblique angle vapor deposition is carried out, with an approach angle of typically 60°, is rotated through 90° after each layer. The lasers to be vapor-coated are alternately rotated through 90° about their axis after each layer. The resulting polarization-dependent refractive index profile is shown in FIG. 5.

In this arrangement, the thicknesses of the layers 4a and 4b are preferably one-quarter of the laser wavelength divided by the respective refractive index n3 and n4. Thus reflections r3 and r4 relative to the reflection of the mirror 3 which are constructive to the polarization Pol 1 are produced, which even increase the total reflection of the mirror 3 somewhat. On the other hand the reflection r3 is destructive to the other polarization Pol 2, as for this polarization the layer 4b with n3 has a smaller refractive index than the layer 4a with n4. A corresponding calculation for a laser at 1.55 μm coated with two Si layers applied by oblique angle vapor deposition (60°) and rotated through 90°, is shown in FIG. 6.

Figure 6:
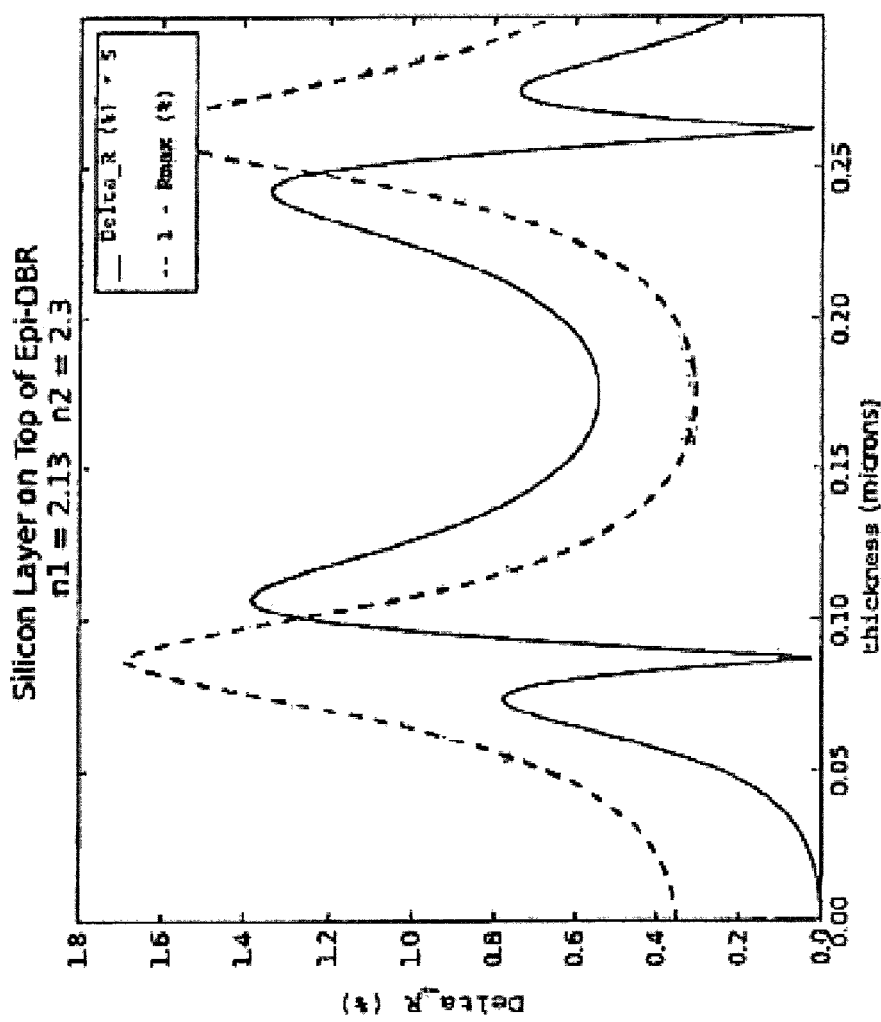
FIG. 6 shows a representation corresponding to FIG. 4 for a structure according to FIG. 5 with two polarization-selective layers plotted against a single layer thickness that is identical for both layers.

As can be clearly seen in FIG. 6, a difference of about 0.1% in the reflectivities of the two polarizations is obtained, for a thickness of about 175 nm of the two layers in each case, corresponding to roughly a quarter of the wavelength, whereas the transmission or total reflection remains substantially constant. An additional advantage over the single-layer arrangement in FIG. 3 is the large processing tolerance with respect to the thickness of the vapor-deposited layers. A layer thickness of between 150 nm and 200 nm produces substantially the same effect on polarization selection and total reflectivity.

Other embodiments of the invention which may have even better properties are shown in FIG. 7. At the top the drawing shows that the layer sequence 4 may consist of more than just one pair of layers with anisotropic dielectrics rotated through 90°. By comparison with FIG. 6 this results in a difference in the polarization-dependent reflectivity that increases roughly proportionally to the number of pairs, and hence also a correspondingly greater stabilization of polarization. At the bottom FIG. 7 shows that the layer sequence 4 may be covered with additional isotropic layers 5. For example, erosion of the anisotropic layers 4 by the ambient air may be prevented by a dense, vertically vapor-deposited protective layer of aluminium oxide or silicon nitride. If the thickness of this protective layer corresponds to half a wavelength of the laser light in the protective layer, this has no effect on the total reflection of the layers 3 and 4.

The production of a sufficiently birefringent (anisotropic) dielectric layer is critical to the function of the present invention. In the present invention this is achieved simply and effectively and without any expensive nanotechnology by oblique angle vapor deposition of the respective layer(s). According to T. Motohiro and Y. Taga, "Thin film retardation plate by oblique deposition", Applied Optics, 28, 2466 (1989) and I. Hodgkinson and Q. Wu, "Serial bideposition of anisotropic thin films with enhanced linear birefringence", Applied Optics, 38, 3621 (1999), in this process self-organized nanostructures are produced in the layer (layers) which lead to shape anisotropy and typically produce a difference in the refractive indices of the two in-plane polarizations (i.e. parallel to the surface of the disc) of up to 5-10%. Particularly high anisotropy can be obtained with silicon layers that are vapor-deposited onto the laser mirrors at an angle of 60° to the surface normal, as shown in G. Beydaghyan et al.: "Enhanced birefringence in vacuum evaporated silicon thin films", Appl. Opt. 43, 5343 (2004). However, the invention is not restricted only to this manufacturing process. Any other method of applying anisotropic dielectric layers is suitable in principle.

The structure according to the invention may be used in particular on BTJ-VCSEL in various material systems. These include GaAs-, InP- and GaSb-based components.

LIST OF REFERENCE NUMERALS 1 mirror
2 active amplifying region, resonator
3 mirror
4, 4a, 4b polarization-selective layer
5 laser cross-section
n1, n2, n3, n4 refractive index
r1, r2, r3, r4 reflectivity
Pol1, Pol2 direction of polarization

The invention claimed is:
1. A surface-emitting laser diode comprising:
an active amplifying region having a resonator length, wherein the active amplifying region is bounded by two laser mirrors that determine the resonator length, while a plurality of polarization-selective layers is provided for stabilizing the polarization in a region that is located on that side of at least one of the laser mirrors that is oppo- site the active amplifying region, these layers extending parallel to the respective mirror and having a polarization-dependent refractive index, the plurality of polarization-selective layers each being alternately rotated through 90° relative to their polarization alignment and their reflection phase being the same as that of the laser mirror on the side of which they are located for one polarization and opposite it for the other polarization.

2. The surface-emitting laser diode according to claim 1, characterized in that a polarization-selective layer is applied directly to one of the mirrors.

3. The surface-emitting laser diode according to claim 1, wherein the plurality of polarization-selective layers on the side remote from the respective laser mirror is or are followed by an isotropic layer consisting in particular of aluminium oxide or silicon nitride, while additionally the thickness of this layer in particular corresponds to half the wavelength of the laser light in this layer.

4. The surface-emitting laser diode according to claim 1, wherein the plurality of polarization-selective layers each consists of a dielectric such as silicon and is produced in particular by oblique angle vapor deposition onto a laser mirror.

5. The surface-emitting laser diode according to claim 2, wherein the plurality of polarization-selective layers on the side remote from the respective laser mirror is or are followed by an isotropic layer consisting in particular of aluminium oxide or silicon nitride, while additionally the thickness of this layer in particular corresponds to half the wavelength of the laser light in this layer.

6. The surface-emitting laser diode according to claim 2, wherein the plurality of polarization-selective layers each consists of a dielectric such as silicon and is produced in particular by oblique angle vapor deposition onto a laser mirror.

7. The surface-emitting laser diode according to claim 3, wherein the plurality of polarization-selective layers each consists of a dielectric such as silicon and is produced in particular by oblique angle vapor deposition onto a laser mirror.

8. The surface-emitting laser diode according to claim 5, wherein the plurality of polarization-selective layers each consists of a dielectric such as silicon and is produced in particular by oblique angle vapor deposition onto a laser mirror.

9. The surface-emitting laser diode according to claim 1, the thickness of each of the polarization-selective layers being $\lambda/4$ divided by the respective refractive index of the polarization-selective layer, $\lambda$ being the wavelength of the surface-emitting laser diode.

* * * * *